US006791351B2

(12) United States Patent
Fischer et al.

(10) Patent No.: US 6,791,351 B2
(45) Date of Patent: Sep. 14, 2004

(54) ELECTROMAGNETIC STATOR INSULATION FLAW DETECTOR

(75) Inventors: Mark William Fischer, Pittsburg, PA (US); James William Shelton, Raytown, MO (US); Michael J. Metala, Murrysville, PA (US)

(73) Assignee: Siemens Westinghouse Power Corporation, Orlando, FL (US)

( * ) Notice: Subject to any disclaimer, the term of this patent is extended or adjusted under 35 U.S.C. 154(b) by 0 days.

(21) Appl. No.: 10/186,048

(22) Filed: Jun. 28, 2002

(65) Prior Publication Data

US 2004/0000923 A1 Jan. 1, 2004

(51) Int. Cl.$^7$ .............................................. G01R 31/34
(52) U.S. Cl. ....................................................... 324/772
(58) Field of Search ................................. 324/772, 546, 324/229–233; 73/12.09, 12.12, 865.8

(56) References Cited

U.S. PATENT DOCUMENTS

| | | | | |
|---|---|---|---|---|
| 4,652,823 A | * | 3/1987 | Sutton ......................... 324/240 |
| 4,658,213 A | | 4/1987 | Finley |
| 4,803,563 A | | 2/1989 | Dailey et al. |
| 4,962,660 A | * | 10/1990 | Dailey et al. ............. 73/12.09 |
| 4,970,890 A | * | 11/1990 | Jaafar et al. ............... 73/12.09 |
| 4,996,486 A | | 2/1991 | Posedel |
| 5,020,234 A | * | 6/1991 | Alkire et al. .......... 324/207.18 |
| 5,105,658 A | | 4/1992 | Jaafar et al. |
| 5,252,915 A | | 10/1993 | Sedding et al. |
| 5,295,388 A | * | 3/1994 | Fischer et al. ............. 73/12.09 |
| 5,321,362 A | | 6/1994 | Fischer et al. |
| 5,341,095 A | | 8/1994 | Shelton et al. |
| 5,365,166 A | | 11/1994 | Dailey et al. |
| 5,557,216 A | | 9/1996 | Dailey et al. |
| 5,907,244 A | | 5/1999 | Crabill et al. |
| 6,051,987 A | | 4/2000 | Stokes |
| 6,469,504 B1 | * | 10/2002 | Kliman et al. ............... 324/228 |
| 2003/0117144 A1 | * | 6/2003 | Sutton ......................... 324/546 |

OTHER PUBLICATIONS

J. Sutton, EL–CID—An Easy Way to Test Stator Cores, CEGB Research, Jun. 1982, pp. 15–21.
J.W. Shelton & B.M. Reichman, A Comparative Analysis of Turbo–Generator Core Inspection Techniques, Westinghouse Power Generation Service Division, American Power Conference, Apr. 22–25, 1985 & Pacific Coast Electrical Assn, Mar. 19–20, 1985.

* cited by examiner

Primary Examiner—David A. Zarneke
Assistant Examiner—Jermele Hollington

(57) ABSTRACT

An electromagnetic generator inspection system that employs a plurality of excitation frequencies and comprises one or more pickup coils that monitor a portion of the interior of a stator core to provide an output that identifies the location, severity and radial depth of any flaw in the insulation covering the laminations that are monitored.

27 Claims, 4 Drawing Sheets

ELECTROMAGNETIC STATOR INSULATION FLAW DETECTOR

BACKGROUND OF THE INVENTION

1. Field of the Invention

The present invention relates generally to inspection of electrical generators using electromagnetic detectors and more particularly to electromagnetic detectors that vary the frequency of the excitation current to provide information on the depth of detected flaws.

2. Related Art

The stator core of a typical large generator, for example, a 500 megawatt generator, weighs 200 tons, is approximately 6 meters long, 2.6 meters in diameter and has a bore of 1.3 meters. The stator is built from a stack of approximately 200,000 individual steel sheets or laminations, each approximately 0.3 mm thick and coated, for example, with a varnish to insulate it electrically from adjacent laminations and the windings that are inserted in peripheral slots that extend circumferentially around the laminations. The core is held together on its outside by steel building bars. On its inside, it carries a winding made from electrically insulated copper bars embedded in slots between the rows of inward facing teeth around the bore.

Within the bore of the stator lies the rotor, which is spun by mechanical power of the turbines to induce electrical power in the stator winding. The rotor itself carries a winding, which is energized by direct current provided by an exciter. As the magnetic flux produced by this winding rotates, it intersects the stator winding and generates the alternating current power, which is the generator's required output. The function of the steel laminations is to ensure that the stator core presents a path of low magnetic impedance to the spinning rotor flux.

It is vital, however, to prevent unwanted currents being generated in the steel of the core (as opposed to the wanted currents in the stator winding). The result would be serious overheating in the core. This is why the laminations are each coated with a thin layer of electrical insulation. The insulation on a group of laminations may, however, become damaged near the bore surface during assembly, operation or maintenance. If this happens, a conducting circuit may be completed, since in many stators, the laminations are also in electrical contact with each other at their outer edges where they are supported by the building bars. The rotating flux will then induce currents around these circuits which can lead to troublesome overheating or hot spots in the damaged area. Hot spots usually occur on or near the stator teeth.

If allowed to persist, the hot spots can damage or possibly cause failure of the electrical insulation around the conductors of the stator winding, necessitating replacement of the conductor. There have been instances where hot spots have grown to such an extent that the core itself has had to be rebuilt.

Primitive forms of hot spot detection at the surface involved exciting the core to operating flux density by means of a temporary High Power Ring Flux Loop (HPRFL). This technique uses a heavy gauge cable loop installed such that it extends through the bore of the stator, then around the outside of the frame, and then through the bore again. Three to ten turns are normally required. The loop is energized with a high voltage and observers are positioned in the bore to manually examine the surface of the stator core. If the area to be examined is limited, the HPRFL method can be used to excite the core after the suspected area is treated with paraffin or paints that change color when heated.

A thermographic inspection technique is an alternative to the hands-on observation of stator damage. This technique also employs the HPRFL to excite the core to operational flux density levels. The entire surface area of the core structure can then be scanned with a television-style camera that is sensitive to infrared radiation. The entire examination is done from the outside end of the core looking into the bore, but it is often desirable to de-energize the HPRFL for a short time to enter the bore and pinpoint sources of heat.

More recently, electromagnetic detectors such as the Electromagnetic Core Imperfection Detector (EL CID) described in U.S. Pat. No. 5,321,362 have been employed for this purpose. This technique employs an excitation loop of #10 AWG 300-volt wire (usually 6 turns) installed in the bore of the stator core, often suspended along the centerline and around the frame in a manner similar to that of the HPRFL technique. The loop is then connected to a source of constant frequency amplitude-adjustable ac voltage (a 240-volt Variac) and energized. A separate single turn search coil determines when the proper level of excitation is obtained. The flux level is approximately 4% of the operating flux density. At this low density, technicians can safely enter the bore with a pickup device that detects axial currents in the laminations or the pickup device can be inserted remotely with small robots such as that described in U.S. Pat. No. 5,557,216, assigned to the assignee of the instant application. The pickup is moved over the entire bore surface in a series of overlapping patterns while the output is observed on a meter and/or plotted on an X-Y recorder or computer. Any areas of elevated axial current in the laminations along the surface or some distance below the surface will be indicated as peaks on the output device. The need for corrective action can be determined objectively by analyzing the peaks. This technique is more fully described in a publication, Sutton, J., July 1980. *Electrical Review*, Vol.207, No. 1, "EL CID: An Easier Way to Test Stator Cores", 33–37. The outputs of the pickup coil can be further processed and analyzed by a computer, which can compare the information to known reference values to assist in characterizing the flaw that was identified. The results provide information on the location of the flaw but not its radial depth.

An improved electromagnetic detector is desired that will provide additional information to further characterize a flaw.

Accordingly, it is an object of this invention to provide an improved electromagnetic detector that can further characterize a flaw in the insulation of the laminations of a stator core.

It is an additional object of this invention to provide such an improved electromagnetic detector that can further characterize the depth of any flaw detected.

It is a further object of this invention to provide an electromagnetic generator stator insulation flaw detector that will speed up the detection process.

SUMMARY OF THE INVENTION

These and other objects are achieved by an electromagnetic detector that employs an excitation coil like that employed with the EL CID technique, which is connected to a variable frequency ac source and generates approximately 4% of the normal operating flux density of a turbine stator. A pickup coil is moved axially along the core at a given circumferential elevation and the output of the pickup coil is interpreted to identify the locations of flaws. The output of the pickup coil is indexed against the axial position of the coil to identify the location of any flaw, which is indicated. The output thus obtained is recorded as the pickup coil is moved from one axial end of the generator stator core to the other, defining a single pass or scan. Multiple measurements are recorded from the pickup coil at different frequencies. Preferably, one at the line frequency, e.g., 60 or 50 hertz, and one at 2000 hertz. If a flaw is detected at a given location, the number of measurements at that location is increased, each respectively at a different frequency.

Preferably, a scan is made at a single frequency and then a second scan, optionally in the reverse direction, is made at a second frequency. When the series of scans is completed across a given circumferential area over the axial length of the stator core, the pickup coil is circumferentially displaced, desirably to the next adjoining area to be scanned that has not as yet been monitored and the process is repeated until the entire surface area of the interior of the stator core has been monitored.

In the preferred embodiment, a plurality of pickup coils respectively monitor adjacent regions simultaneously. The adjacent pickup coils are circumferentially aligned as they traverse the stator core axially. The output of the plurality pickup coils is preferably multiplexed to a computer for storage, analysis and display. Desirably, the plurality of outputs are displayed together. In another embodiment, more than one pickup coil is employed at a given circumferential location with each coil having a different, but overlapping monitored area. The coils can employ multiple windings tuned to the different frequencies to optimize the coil output.

BRIEF DESCRIPTION OF THE DRAWINGS

The invention may be better understood, and further advantages and uses thereof, are readily apparent, when considered in view of the following detailed description of the exemplary embodiments, taken with the accompanying drawings in which.

DESCRIPTION OF THE PREFERRED EMBODIMENT

Figure 1:
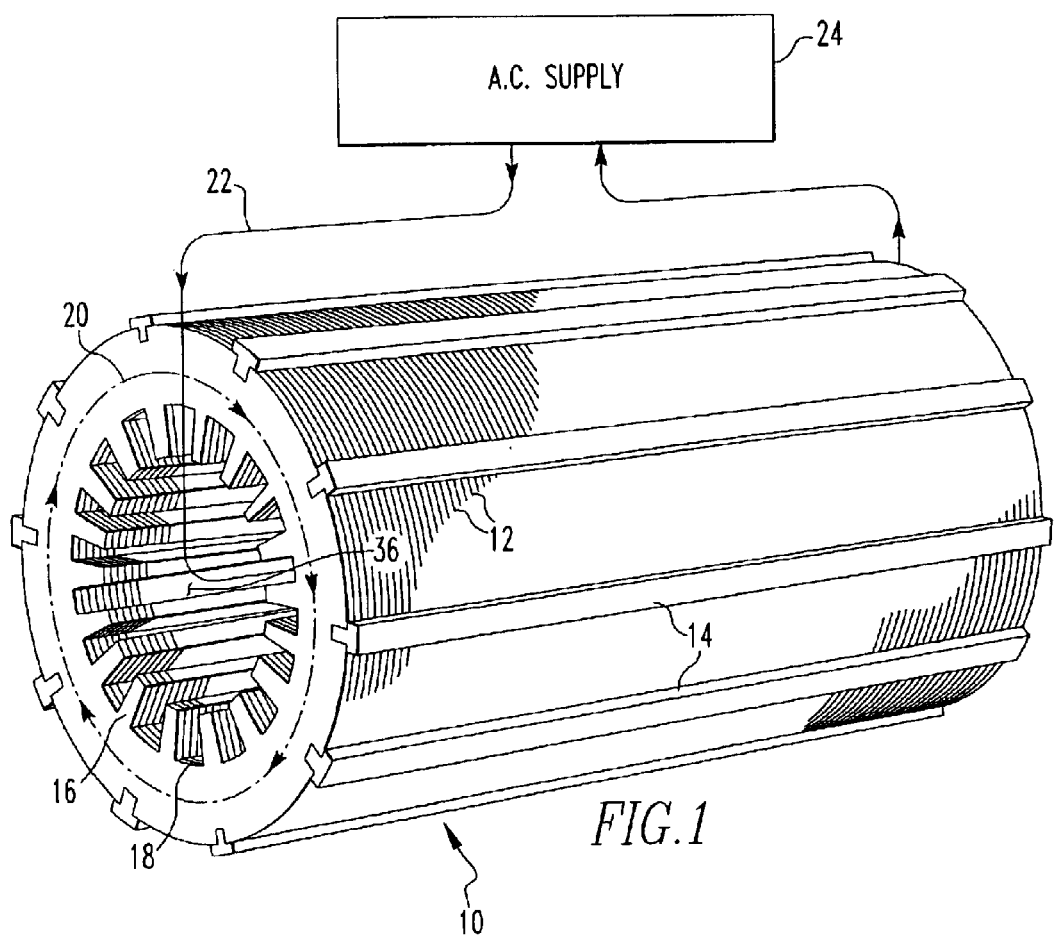
FIG. 1 is a perspective view of a stator core with its rotor and conductor bars removed, showing a temporary ring-flux winding which is used to drive alternating flux around the core.
Figure 2:
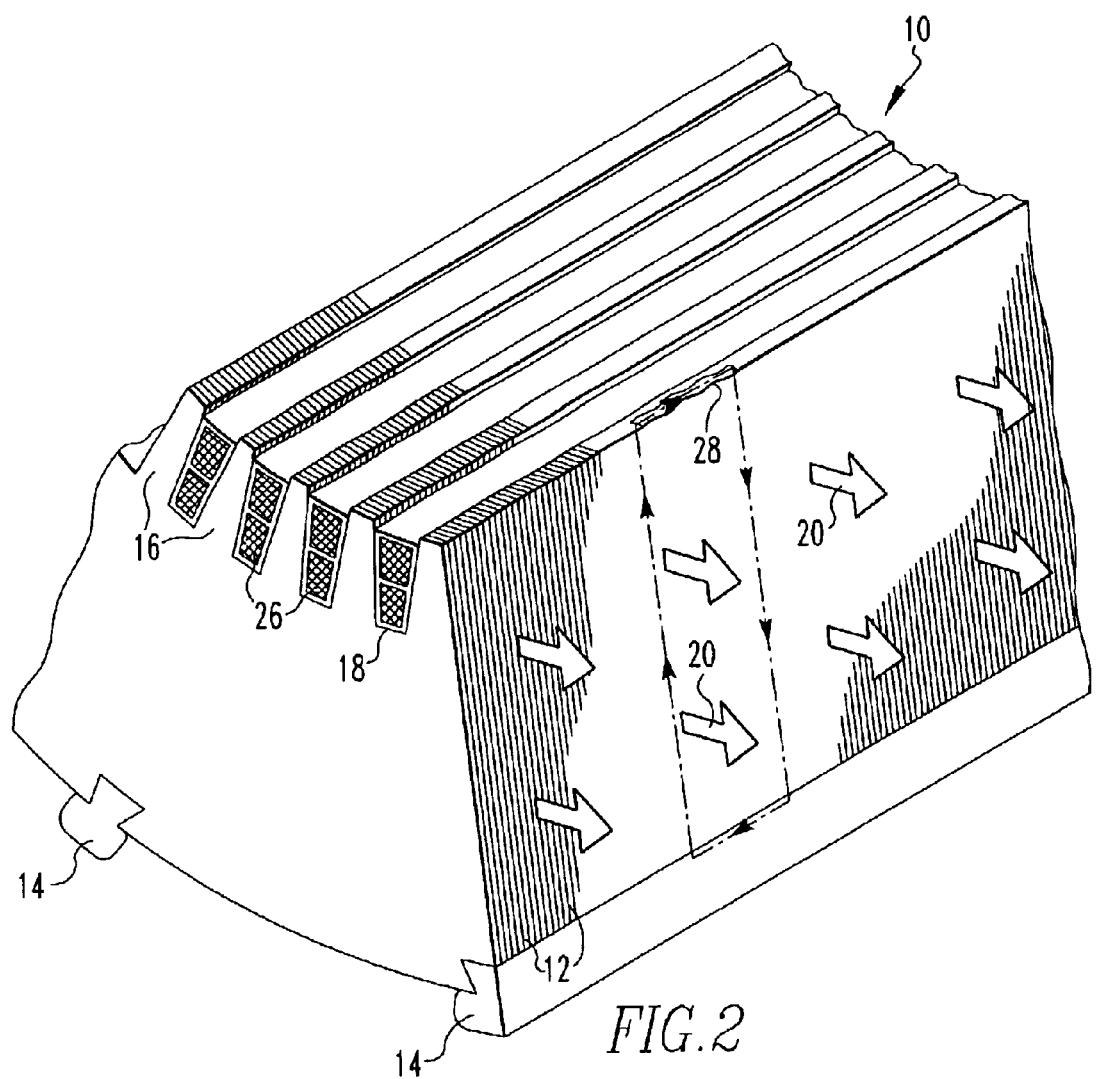
FIG. 2 is a perspective view of a circumferential section of a stator core having a surface flaw in several adjacent laminations, showing currents induced by the magnetic flux as a result of this damage.

A simplified diagram of a generator stator core with its rotor and conductors removed is illustrated in FIG. 1. The core 10 is made up of a plurality of thin laminations 12 each in the order of 0.3 mm thick, including a thin insulation coating such as varnish to insulate it electrically from its neighboring laminations against which it abuts. The laminations can better be viewed with reference to FIG. 2, which shows a circumferential section of the stator core with the conductors in place within the stator slots 18 wedged between the stator teeth 16. An excitation winding of approximately 6 turns of #10 AWG 300-volt wire is installed in the stator bore 36, suspended along the center line and around the frame in a manner similar to that of the HPRFL and EL CID techniques. The excitation winding 22 is connected to a variable frequency ac voltage source, e.g., 240 volts Variac, and energized. The excitation current sets up an alternating magnetic flux 20 in each of the laminations 12. The building bars 14 that secure the tandem arrangement of laminations, which can be as large as 200,000 or more individual sheets of steel, are secured in place and the laminations are electrically connected by the building bars 14. However, the amount of current that flows between laminations is negligible because there is no electrical return path from the building bars 14 if the insulation covering the laminations is intact. Although, if a flaw in the insulation exists, such as the surface flaw 28 shown on a stator tooth in FIG. 2, the flaw in the insulation does create a return path that will cause localized heating of the laminations under normal generator operating conditions. The localized heating in operation will cause further degradation if left unattended and can even compromise the insulation around the conductor bars 26 in the slots 18 or the insulation on the laminations 12. The alternating magnetic flux 20 created by the excitation coil 22 is only approximately 4% of the flux density that the stator experiences during normal generator operation.

Figure 3:
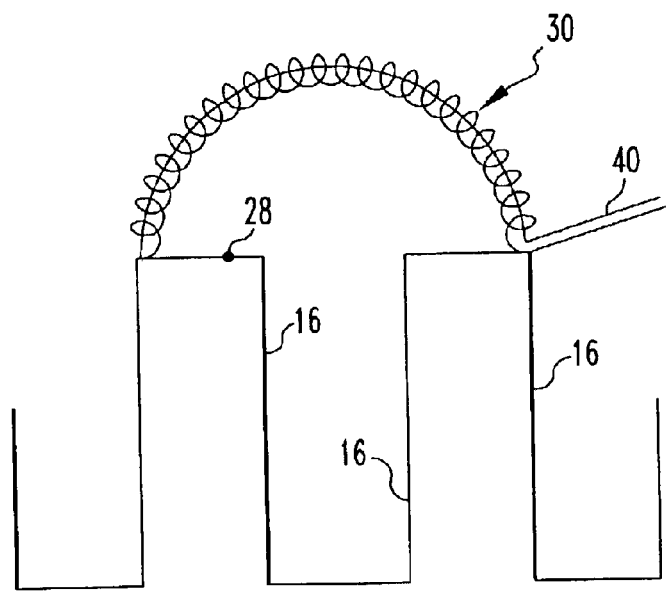
FIG. 3 is a schematic view of a pickup coil employed by this invention which is shown spanning two stator teeth.

FIG. 3 schematically shows three stator teeth 16 along a small circumferential internal section of a stator with a pickup coil 30 of this invention spanning two of the stator teeth 16. In accordance with the preferred method of this invention, the pickup coil or sensor 30 would be moved from one end of the stator 10 along the two adjacent teeth 16 axially through the bore 36 of the stator core 10 with the variable frequency ac supply 24 set at a first frequency which is preferably the line frequency, i.e., 50 or 60 hertz. One complete pass or scan through the axial dimension of the core portion spanned by the sensor 30 is made before the frequency of the source 24 is changed. At the end of the first pass, the frequency of the source is preferably raised to a much higher frequency such as 2,000 hertz and the pickup coil 30 is then moved in the opposite direction until the reverse pass is complete, returning to its point of origin. During both passes, the output signal 40 is monitored and indexed to the axial location at which the signal was generated so that any spike in the signal indicative of a fault current 28 will identify the location of the fault. If a flaw or fault is so identified, the pickup coil is moved back to that position and the area is monitored while the ac supply is varied to one or more additional frequencies. The output signal 40 can be filtered and digitized and sent to a computer 42 which can analyze the data in comparison to a database of known flaws and interpret not only the existence of the flaw and its location, but also from the several responses obtained at different frequencies at the same location, the computer can identify the radial depth of the flaw. This technique for analyzing and digitally interpreting such an output obtained at a single frequency is more fully described in U.S. Pat. No. 5,321,364, issued Jun. 14, 1994 to the assignee hereof.

While frequencies in the order of 10,000 kilohertz can also be employed, experimental results have shown that use of a range of frequencies between the line frequency and approximately 2,000-kilohertz provides optimum outputs for identifying the depth of a flaw. Additionally, though each pass was described as being carried out at a single frequency with subsequent passes, respectively conducted at different frequencies, carried out in series, it is also possible to sweep the frequency of excitation as the pickup device is transported axially down the stator. A computer algorithm can then estimate the depth of any imperfection that is detected. One would normally expect that as the frequency of the excitation is increased, the imperfections that are further away from the excitation coil will attenuate more quickly than the imperfections that are closer to the excitation coil. However, experimental results have found just the opposite. Flaws on the surface of the teeth induce a response in the pickup coil which increases at a lesser rate than the response received from flaws at greater depths, with the rate increasing with increased radial depth of the flaw. Furthermore, while a single pickup coil 30 is shown, the coil 30 can comprise a number of concentric coils, each wound on the same form with insulation in between and each winding having a different number of turns (winding density) optimized to the various frequencies employed for the excitation current. The separate outputs of the coils are then connected through a switching box to a computer as the frequency of the excitation current is changed.

Figure 4:
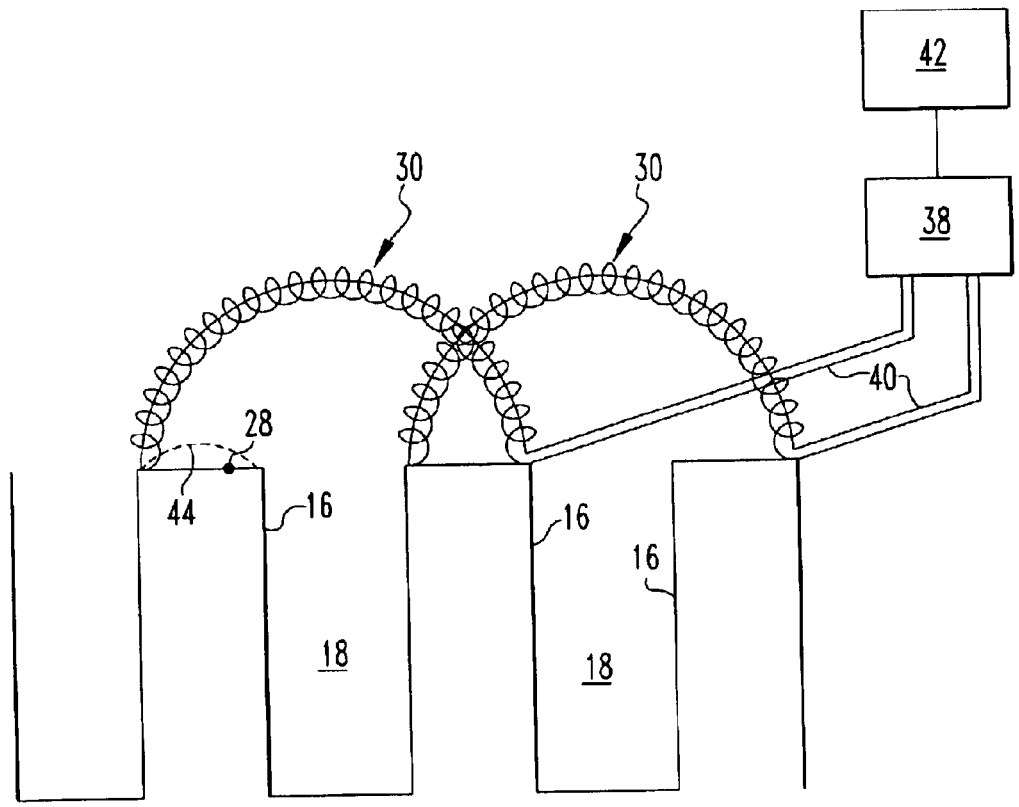
FIG. 4 is a schematic view of two pickup coils employed by this invention which are spanning adjacent monitored sections of the internal circumference of a stator core.

Another feature of this invention is that it is capable of analyzing multiple pickup devices 30 at the same time as illustrated in FIG. 4. Preferably, the pickup devices 30 are positioned to monitor adjacent portions of the circumference of the interior of the stator as illustrated in FIG. 4. While FIG. 4 shows two such coils 30 positioned to monitor the area surrounding adjacent slots 18, it should be appreciated that three or more such sensors 30 can be employed at the same time. Desirably, the sensors 30 are positioned at approximately the same axial location in the bore and moved together as a unit so the outputs can be compared directly to provide more information about any flaw detected. The outputs 40 are connected to a multiplexing unit 38, which conveys the multiplex signal to the computer 42. The analyzing of multiple pickup devices at one time has several advantages. One advantage is that the inspection time is reduced in proportion to how many pickup devices are employed. It also allows for different size and configurations of pickup devices to be used at the same time. For example, a shorter pickup coil 44 shown in outline form can be used together with the pickup coil 30 covering an overlapping monitored area which improves the ability of the system to identify the depth of an imperfection detected in the monitored area. Alternately, one coil can span the standard two teeth 16 while a second coil spans one tooth to provide this additional information.

Figure 5:
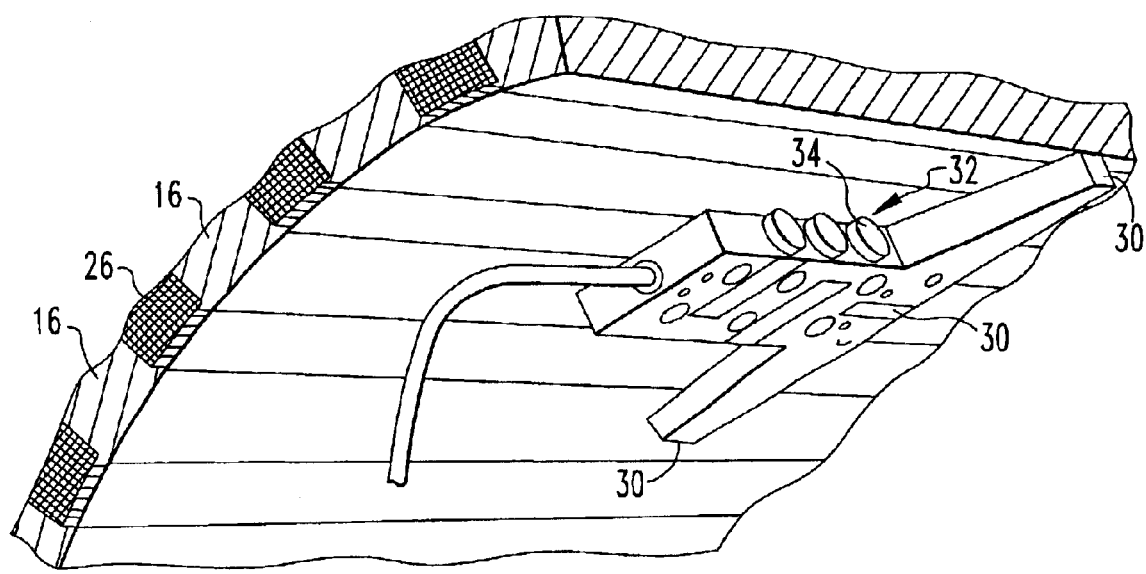
FIG. 5 is a schematic view of a robotic positioner, which can be employed to position the pickup coils of this invention, deployed on the interior surface of a stator core.

FIG. 5 illustrates a moveable carriage that can be used to position the pickup coil 30 of this invention. The carriage is shown riding on the interior surface of the stator bore and typically has wheels or treads 34 that are magnetized to be attracted and ride on the stator teeth 16 to maintain traction and overcome the effects of gravity. The leading edge of the carriage, though not shown to scale, can have wings, which support the sensors 30 over adjacent slots. A carriage 32 such as the one illustrated in FIG. 5 can thus readily support three such sensors over three adjacent slots 18. Carriages of this type are more fully described in U.S. Pat. No. 5,557,216 and U.S. patent application Ser. No. 09/995,182, filed Nov. 27, 2001.

As the foregoing detailed description illustrates, the present invention comprises an electrical generator inspection system employing one or more electromagnetic sensors that monitor the response to various excitation frequencies to determine not only the extent and location of a flaw, but its radial depth as well. It will be appreciated by those skilled in the art that changes could be made to the embodiment described above without departing from the broad inventive concepts thereof. It is understood, therefore, that this invention is not limited to the particular embodiment disclosed, but is intended to cover all modifications which are within the scope of the invention as defined by the appended claims.

What is claimed is:

1. An electrical generator inspection system for detecting insulation breakdown axially between two or mare adjacent laminates of a generator stator core comprising:

an electromagnetic detector having an excitation coil for carrying an alternating current and inducing eddy currents in the laminates, said electromagnetic detector providing output signals representative of fault currents detected due to defects in the insulation between laminates axially along the stator core, said output signals providing information on the axial location along the stator core at which the fault currents are detected; and means for varying a frequency of the alternating current so that said output signals also provide information on a depth, radially, of the fault currents within the laminations, wherein the frequency of the alternating current is varied within a frequency range of approximately the frequency of a local electrical grid network and two kilohertz.

2. The electrical generator inspection system of claim 1 wherein the frequency of the alternating current is varied within a frequency range of approximately the frequency of a local electrical grid network ten kilohertz.

3. The electrical generator inspection system of claim 1 wherein said laminates have a plurality of spaced teeth respectively, radially extending around the peripheral circumference of said laminates with a surface between adjacent teeth defining a slot designed to seat a stator core winding and wherein the electromagnetic detector includes a plurality of pickup coils responsive to the fault currents to provide said output signals, respective ones of said pickup coils operable to monitor different areas of said laminates at approximately the same time.

4. The electrical generator inspection system of claim 3 including a recorder for recording said output signals from said plurality of pickup coils at the same time.

5. The electrical generator inspection system of claim 4 including a display for displaying more than one of said output signals at the same time.

6. The electrical generator inspection system of claim 3 wherein said plurality of pickup coils include at least two pickup coils that are designed to monitor two different circumferential locations on an interior of the generator stator core at substantially the same time.

7. The electrical generator inspection system of claim 6 including a multiplexer connected to said pickup coils for multiplexing said outputs to a processing unit for interpreting said output signals.

8. The electrical generator inspection system of claim 6 including means for translating the at least two pickup coils circumferentially around the interior of the stator core.

9. The electrical generator inspection system of claim 6 wherein the at least two pickup coils are constructed to monitor different axial lengths of the stator care.

10. The electrical generator inspection system of claim 6 wherein at least one of the pickup coils includes a plurality of windings with at least two of said windings being insulated from each other and having a different number of turns, and further including means for switching between said windings to provide said output signals.

11. The electrical generator inspection system of claim 6 wherein the two different circumferential locations are substantially inline with approximately the same axial position on the stator core.

12. The electrical generator inspection system of claim 11 wherein the two different circumferential locations are adjacent respective slots and each pickup coil is moved at substantially the same time, at substantially the same rate, parallel to its corresponding slot, along the axis of the generator.

13. The electrical generator inspection system of claim 12 wherein the same drive moves the at least two pickup coils.

14. The electrical generator inspection system of claim 6 wherein the at least two pickup coils are constructed to have different response characteristics.

15. The electrical generator inspection system of claim 14 wherein the difference in response characteristics of the at least two pickup coils is established by each coil having a different winding density.

16. A method of inspecting an electrical generator stator core to determine insulation breakdown axially between two or more adjacent laminates of a generator stator core with an electromagnetic detector having an excitation coil for carrying an alternating current and means for varying the frequency of an ac current connected to the excitation coil, comprising the step of:
    positioning the excitation coil so that it will create a magnetic field that will generate eddy currents in the area of the stator to be inspected;
    setting the ac current at a first frequency;
    monitoring a first output of a pickup coil positioned adjacent a first location on the stator core with die an current set at said first frequency;
    adjusting the ac current to a second frequency which is different from the first frequency; and
    monitoring a second output of the pickup coil positioned adjacent the first location on the stator core with the an current set at the second frequency.

17. The method of claim 16 including the step of comparing the first and second outputs received at the first location.

18. The method of claim 16 wherein the monitoring step monitors at least two pickup coils and the area monitored by the at least two pickup coils overlap.

19. The method of claim 16 including the step of identifying from the first or second output when a flaw exists in the insulation over an area monitored at the first position and when a flaw is identified, increasing the number of different frequencies of the ac current that the pickup coil monitors at the first location over the number of frequencies monitored when no flaw is identified.

20. The method of claim 16 including scanning the pickup coil from a first axial end of the stator core to a second end of the stator core, while maintaining approximately the same circumferential position, before adjusting the so current to the second frequency.

21. The method of claim 20 including the step of scanning the pickup coil axially while the current is set at the second frequency before changing the circumferential position of the pickup coil.

22. The method of claim 21 wherein the step of scanning at the second frequency is performed from the second end to the first axial end of the stator core.

23. The method of claim 16 wherein the monitoring step monitors the first output of at least two pickup coils respectively, circumferentially spaced at a first axial location.

24. The method of claim 23 wherein the first output of the at least two pickup coils are monitored substantially simultaneously.

25. The method of claim 24 including the step of multiplexing the first output of the at least two pickup coils.

26. The method of claim 23 including the step of moving the at least two pickup coils axially along the stator while maintaining the at least two pickup coils substantially in the same redial plane as they move axially.

27. The method of claim 23 including the step of positioning the at two circumferentially spaced pickup coils at adjacent monitored locations.

* * * * *